US009219182B2

(12) United States Patent
Chen et al.

(10) Patent No.: US 9,219,182 B2
(45) Date of Patent: Dec. 22, 2015

(54) OPTOELECTRONIC DEVICES INCORPORATING FLUOROPOLYMER COMPOSITIONS FOR PROTECTION

(75) Inventors: Xuming Chen, Pearland, TX (US); Pak-Wing S. Chum, Montgomery, TX (US); Kevin E. Howard, Midland, MI (US); Leonardo C. Lopez, Midland, MI (US); William C. Sumner, Midland, MI (US); Shaofu Wu, Sugar Land, TX (US)

(73) Assignee: Dow Global Technologies LLC, Midland, MI (US)

( * ) Notice: Subject to any disclaimer, the term of this patent is extended or adjusted under 35 U.S.C. 154(b) by 49 days.

(21) Appl. No.: 14/131,103

(22) PCT Filed: Jul. 3, 2012

(86) PCT No.: PCT/US2012/045396
§ 371 (c)(1),
(2), (4) Date: Jan. 6, 2014

(87) PCT Pub. No.: WO2013/006616
PCT Pub. Date: Jan. 10, 2013

(65) Prior Publication Data
US 2014/0124031 A1 May 8, 2014

Related U.S. Application Data

(60) Provisional application No. 61/504,851, filed on Jul. 6, 2011.

(51) Int. Cl.
*H01L 31/00* (2006.01)
*H01L 31/048* (2014.01)
*C08K 5/00* (2006.01)

(52) U.S. Cl.
CPC ............ *H01L 31/0481* (2013.01); *C08K 5/005* (2013.01); *H01L 31/048* (2013.01); *Y02E 10/50* (2013.01)

(58) Field of Classification Search
CPC combination set(s) only.
See application file for complete search history.

(56) References Cited

U.S. PATENT DOCUMENTS 3,524,906 A 8/1970 Schmitt et al.
4,500,694 A 2/1985 Ohmori et al.
(Continued)

FOREIGN PATENT DOCUMENTS

EP 0 424 153 A2 4/1991
JP 06248224 9/1994
(Continued)

OTHER PUBLICATIONS

Author Unknown, GuideChem, CAS No. 91613-21-7 accessed from http://www.guidechem.com/cas-916/91613-27-7.html.*
(Continued)

*Primary Examiner* — Eli Mekhlin
(74) *Attorney, Agent, or Firm* — Kagen Binder, PLLC

(57) ABSTRACT

The fluoropolymer compositions of the present invention generally incorporate ingredients comprising one or more fluoropolymers, an ultraviolet light protection component (hereinafter UV protection component), and optionally one or more additional ingredients if desired. The UV protection component includes a combination of at least one hindered tertiary amine (HTA) compound having a certain structure and a weight average molecular weight of at least 1000. This tertiary amine is used in combination with at least one organic, UV light absorbing compound (UVLA compound) having a weight average molecular weight greater than 500. When the HTA compound and the UVLA compound are selected according to principles of the present invention, the UV protection component provides fluoropolymer compositions with significantly improved weatherability characteristics for protecting underlying materials, features, structures, components, and/or the like. In particular, fluoropolymer compositions incorporating the UV protection component of the present invention have unexpectedly improved ability to resist blackening, coloration, or other degradation that may be caused by UV exposure. As a consequence, devices protected by these compositions would be expected to have dramatically improved service life. The compositions have a wide range of uses but are particularly useful for forming protective layers in optoelectronic devices.

15 Claims, 11 Drawing Sheets

(56) References Cited

U.S. PATENT DOCUMENTS

| | | | |
|---|---|---|---|
| 4,566,755 | A | 1/1986 | Ohmori et al. |
| 4,569,871 | A | 2/1986 | Ohmori et al. |
| 4,609,715 | A | 9/1986 | Koishi et al. |
| 4,732,941 | A | 3/1988 | Numa |
| 4,742,140 | A | 5/1988 | Greenwood et al. |
| 4,931,324 | A | 6/1990 | Ellison et al. |
| 5,254,608 | A | 10/1993 | McClure |
| 5,547,558 | A | 8/1996 | Sakamoto et al. |
| 5,582,653 | A | 12/1996 | Kataoka et al. |
| 5,582,853 | A | 12/1996 | Marnocha et al. |
| 5,707,697 | A | 1/1998 | Spain et al. |
| 5,897,940 | A * | 4/1999 | Malhotra .................... 428/32.13 |
| 6,242,547 | B1 | 6/2001 | Uschold |
| 6,261,676 | B1 | 7/2001 | Olson et al. |
| 6,352,764 | B1 | 3/2002 | Andrus, Jr. et al. |
| 6,403,740 | B1 | 6/2002 | Uschold |
| 6,555,190 | B1 | 4/2003 | Tsai |
| 7,553,540 | B2 | 6/2009 | Debergalis et al. |
| 2001/0036544 | A1* | 11/2001 | Hori et al. ..................... 428/220 |
| 2007/0166562 | A1 | 7/2007 | Swei et al. |
| 2007/0212557 | A1* | 9/2007 | Higuchi et al. ............... 428/447 |
| 2008/0145652 | A1 | 6/2008 | Bonnet et al. |
| 2009/0291238 | A1* | 11/2009 | Scott et al. ..................... 428/34 |
| 2010/0147364 | A1* | 6/2010 | Gonzalez et al. ............. 136/251 |
| 2011/0297228 | A1* | 12/2011 | Li et al. ......................... 136/259 |

FOREIGN PATENT DOCUMENTS

| | | |
|---|---|---|
| JP | 2002-256217 | 9/2002 |
| WO | WO 2007/092541 | 8/2007 |
| WO | WO 2008/057045 | 5/2008 |
| WO | WO 2009/061956 | 5/2009 |
| WO | WO 2011/071847 | 6/2011 |

OTHER PUBLICATIONS

Author Unknown, CIBA® TINUVIN 622®, product guide, Sep. 2006.*

Autran et al, "New Fluoropolymer Latex Clearcoat Technology for the Enhanced Protection of Heat-Sensitive Substrates," JCT Coatings Tech, pp. 44-49, Feb. 2009.

Encyclopedia of Polymer Sci & Eng., 2nd Ed, vols. 16 and 17, John Wiley & Sons, pp. 1281-1282, 2013.

PCT Written Opinion of the Int. Searching Authority, PCT/US2012/045396, pp. 1-5, dated Sep. 6, 2012.

* cited by examiner

OPTOELECTRONIC DEVICES INCORPORATING FLUOROPOLYMER COMPOSITIONS FOR PROTECTION

PRIORITY

This application claims the benefit from International No. PCT/US2012/045396, which was granted an International filing date of Jul. 3, 2012, which in turn claims priority from U.S. Provisional patent application having Ser. No. 61/504, 851, filed on Jul. 6, 2011, by Chen et al. and entitled OPTOELECTRONIC DEVICES INCORPORATING FLUOROPOLYMER COMPOSITIONS FOR PROTECTION, which applications are incorporated herein by reference in their respective entireties.

STATEMENT REGARDING FEDERALLY SPONSORED RESEARCH OR DEVELOPMENT

This invention was made with U.S. Government support under contract DE-FC36-07G01754 awarded by the Department of Energy. The U.S. Government has certain rights in this invention.

FIELD OF THE INVENTION

The present invention relates to optoelectronic devices incorporating fluoropolymer compositions that are used in a manner effective to help protect the devices from the environment. More specifically, the present invention relates to optoelectronic devices wherein the fluoropolymer compositions include a UV protection component comprising both a hindered tertiary amine compound having a favorable molecular weight and structure and at least one UV light absorbing compound having a favorable molecular weight.

BACKGROUND OF THE INVENTION

Photovoltaic (PV) cells, also referred to as solar cells, are one type of optoelectronic device used to produce electrical energy from sunlight. These solar cells are built from various semiconductor systems which must be protected from environmental effects such as moisture, oxygen, and ultraviolet (UV) light. The cells are usually packaged on both sides by encapsulating layers of glass and/or plastic films forming a multilayer structure known as a photovoltaic module.

One important consideration in developing cost effective thin film PV modules is the ability to use low cost commodity polymers such as transparent polyolefins, poly(meth)acrylates, or the like as PV module encapsulant materials. However, transparent polyolefins and poly(meth)acrylates generally do not meet the long-term requirements of the application (at least 20 years) with respect to outdoor weatherability. The failure is due to the aging effects of water, oxygen, UV exposure and temperature.

Manufacturers have added UV radiation absorbers to polymer films in an effort to protect against UV degradation and improve long-term weatherability. However, high concentrations of ultraviolet radiation absorbers typically result in decreased mechanical performance of the polymer film. Higher concentrations also can cause haze within the polymer film, which reduces the amount of light captured by the devices. In addition, previous investigators have noted leaching of UV absorbers from polymer films. Underlying substrates or components may be damaged as the protective film degrades. This, of course, leads to decreased performance over time. As a result, the lifetime of the polymer films and devices incorporating these films may be limited. As such, improved weatherable polymer films are desired. Fluoropolymer compositions are widely recognized as a useful component as a potential top layer in photovoltaic modules due to their excellent surface properties (e.g., low surface tension that provides stain resistance and repels dirt), optical properties, electronic properties, and weatherability. Since UV radiation will affect the physical properties of materials under the fluoropolymer protection layer, adding the UV blocking functionality in the fluoropolymer top protection layer offers the potential to increase the weatherability of underlying layers.

However, the low solubility and/or high mobility of typical ultraviolet light absorbers in fluoropolymers make it difficult to maintain high levels of these compounds in fluoropolymeric films. The compounds tend to migrate within or even out of the film. Migration is particularly problematic. If ingredients are too mobile, the ingredients can migrate within the film as well as from the film. Migrating materials can contaminate other materials or interfaces between materials. This can lead to hazing, delamination, loss of transparency, loss of UV protection, degradation, and/or the like. The protective properties of the compounds may be lost or degraded in areas where migration has occurred. Some kinds of ultraviolet absorbers also are unduly reactive with fluoropolymers, further undermining protection.

Therefore, a need remains for ultraviolet UV protection strategies that are compatible with and resist blooming out of fluoropolymers, and for products such as fluoropolymeric films and other articles that incorporate such protection.

SUMMARY OF THE INVENTION

The fluoropolymer compositions of the present invention generally incorporate ingredients comprising one or more fluoropolymers, an ultraviolet light protection component (hereinafter UV protection component), and optionally one or more additional ingredients if desired. The UV protection component includes a combination of at least one hindered tertiary amine (HTA) compound having a certain structure (see below) and a weight average molecular weight of at least about 1000. This tertiary amine is used in combination with at least one organic, UV light absorbing compound (DVLA compound) having a weight average molecular weight greater than about 500. When the HTA compound and the DVLA compound are selected according to principles of the present invention, the UV protection component provides fluoropolymer compositions with significantly improved weatherability characteristics for protecting underlying materials, features, structures, components, and/or the like. Additionally, fluoropolymer compositions incorporating the UV protection component of the present invention have unexpectedly improved ability to resist blackening, coloration, or other degradation that may be caused by UV exposure. As a consequence, devices protected by these compositions would be expected to have dramatically improved service life. The compositions have a wide range of uses but are particularly useful for forming protective layers in optoelectronic devices.

In one aspect, the present invention relates to an optoelectronic device comprising a protective film, said protective film comprising:
  (a) a fluoropolymer content comprising at least one fluoropolymer, wherein less than 10 weight percent of the fluoropolymer content is derived from vinylidene fluoride;
  (b) a protection component in admixture with the fluoropolymer content that helps to protect the device from ultraviolet light degradation, wherein the film comprises from 0.01 to 10 parts by weight of the protection component per 100 parts by weight of the fluoropolymer content, and wherein the protection components comprises:
  i) at least one organic, UVLA compound having a weight average molecular weight of at least 500; and
  (ii) at least one hindered, tertiary amine (HTA) compound having a weight average molecular weight of at least 1000, wherein the hindered tertiary amine comprises a cyclic moiety comprising a tertiary amine moiety, wherein a nitrogen atom of the amine moiety is a backbone constituent of the cyclic moiety and is N-substituted, wherein the HTA compound does not include a primary or a secondary amine moiety, and wherein the weight ratio of the at least one UVLA compound(s) to the at least one hindered tertiary amine is in the range from 1:50 to 50:1.

In another aspect, the present invention relates to a flexible optoelectronic device, comprising:
  (a) at least one solar cell having a light incident face and a backside face;
  (b) at least one barrier helping to protect the backside face of the solar cell from the environment; and
  (c) at least one barrier helping to protect the light incident face of the solar cell, said barrier comprising at least one fluoropolymer film, at least one additional protecting film underlying the fluoropolymer film, and at least one adhesion layer adhering the fluoropolymer film to an underlying layer, wherein at least one of the at least one additional film and/or the adhesion layer comprises at least one ingredient that is susceptible to migration and/or degradation when exposed to UV light and wherein the fluoropolymer film comprises:
    (i) a fluoropolymer content comprising at least one fluoropolymer, wherein less than 10 weight percent of the fluoropolymer content is derived from vinylidene fluoride;
    (ii) at least one UVLA compound in an amount effective to help protect the at least one ingredient of the additional, underlying film from UV exposure, wherein the UVLA compound has a weight average molecular weight of at least 500; and
    (iii) at least one hindered, tertiary amine that comprises a cyclic moiety comprising a tertiary amine moiety, wherein a nitrogen atom of the amine moiety is a backbone constituent of the cyclic moiety and is N-substituted, wherein the hindered tertiary amine does not include a primary or a secondary amine moiety, and wherein the weight ratio of the at least one UVLA compound(s) to the at least one hindered tertiary amine is in the range from 1:50 to 50:1.

DETAILED DESCRIPTION OF PRESENTLY PREFERRED EMBODIMENTS

Figure 1:
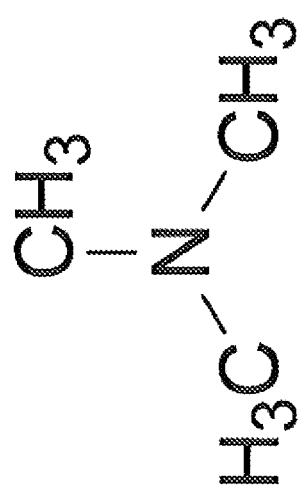
FIG. 1 shows an example of an amine that is not hindered.

The fluoropolymer compositions of the present invention generally incorporate ingredients comprising one or more fluoropolymers, an ultraviolet light protection component (hereinafter UV protection component), and optionally one or more additional ingredients if desired. The UV protection component includes a combination of at least one hindered tertiary amine (HTA) compound and at least one UV light absorbing compound (UVLA compound). The addition of the HTA compound and the UVLA compound provides better weatherability to ingredients included in the fluoropolymers compositions as well as materials/films/structures that are below the fluoropolymer film. The fluoropolymers themselves generally are UV stable, however. The compositions have a wide range of uses but are particularly useful for forming protective layers in optoelectronic devices. In preferred embodiments, the HTA compound is aliphatic.

The fluoropolymer constituents of the fluoropolymer compositions tend to be very stable to UV exposure and have excellent weatherability characteristics. Nonetheless, it is still desirable to incorporate the UV protection component into the fluoropolymer compositions for at least two reasons. First, the UV protection component protects other constituents of the fluoropolymer compositions against degradation due to UV exposure. Second, incorporating UV protection into the fluoropolymer composition also protects underlying substrates from damage due to UV exposure. Optionally, ingredients that provide UV protection optionally also can be incorporated into all or a portion of the underlying substrate as well.

In particular, incorporating UV protection ingredients into the fluoropolymer composition helps to protect the interlayer adhesion between the resultant fluoropolymer composition and adjacent material onto which the fluoropolymer composition is coated, applied as a film, or otherwise provided. If the interface is not protected, the interface might degrade too much due to UV exposure. As one consequence of degradation, material at or proximal to the interface might crystallize in some instances. This tends to increase haze while reducing the transmission of visible light. These effects can adversely impact the performance of an optoelectronic device in which the interface is incorporated. Even for devices in which optical clarity is not a concern, the UV degradation at the interface can still adversely impact performance and service life. For example, interface degradation could contribute to delamination between materials adjacent the affected interface.

As used herein, the term "coating" refers to a film or layer of material that is formed by coating or otherwise applying a fluid admixture onto a substrate and then allowing or causing the coated fluid to solidify via physical and/or chemical processes to form the coating. A coating, thus, is a type of film or layer. The terms "film" or "layer" are used interchangeably and are intended to more broadly encompass films, coatings, pre-formed sheets, a laminate plies, strata, or the like regardless of the manner in which such film or layer is formed.

As used herein, ultraviolet (UV) light refers to electromagnetic energy that has a shorter wavelength than visible light but a longer wavelength than x-rays. Generally, UV light has a wavelength in the range from about 10 nm to about 400 nm. Visible light refers to the portion of the electromagnetic spectrum that is visible to the human eye. Visible light generally has a wavelength in the range from about 400 nm to about 800 nm.

The fluoropolymer compositions provide protection against UV exposure by one or more mechanisms believed to involve absorbing, blocking, and/or otherwise protecting against UV exposure. The ability of a composition to protect against UV exposure can be assessed in terms of the ability of the composition to block transmission of UV light having a wavelength of 350 nm. Generally, a lower transmittance of UV light at this wavelength indicates better UV blocking, and hence a material with better UV protection characteristics. Desirably, therefore, fluoropolymer compositions of the present invention have a UV light transmittance at 350 nm prior to (e.g., as initially formed) and/or after 2000 hours of QUV-A aging (defined below) of about 50% or less, preferably about 15% or less, more preferably 10% or less, even more preferably about 5% or less for a layer having a thickness of about 60 micrometers. A method for measuring transmittance of UV light at 350 nm is described below.

The fluoropolymer compositions desirably are transparent with respect to visible light, i.e, light having a wavelength in the range from 400 nm to 800 nm. In preferred embodiments the fluoropolymer compositions desirably are substantially transparent to visible light, particularly when the compositions of the present invention are used as protective layers covering the light incident face(s) of optoelectronic devices. An exemplary embodiment of a fluoropolymer composition is sufficiently transparent to visible light such that a film of the composition having a thickness of about 60 micrometers has a visible light transmittance from 400 nm to 800 nm prior to aging of at least 70%, preferably higher than 85%, more preferably higher than 90%, even more preferably at least about 93%, and even more preferably at least about 95%. Further, it is also desirable that the fluoropolymer compositions have a visible light transmittance after 2000 hours of QUV-A aging (defined below) that is at least about 70%, preferably at least about 85%, more preferably at least about 90% for a layer having a thickness of about 60 micrometers. Thus, the fluoropolymer compositions may be formulated to provide layers that have a high transmittance rate for visible solar energy.

Visible light transmittance and haze are measured using a BYK Gardner (Haze-Gard Plus) instrument according to the ASTM D-1003D-07 wherein the measured transmittance is the total transmittance obtained by the method in the range from 400 nm to 800 nm at room temperature. Transmittance at 350 nm was obtained from UV-Vis measurement. Using the UV-Vis spectrometer with scanning double monochromator and integrating sphere accessory, the Spectralon™ diffuse reflectance standards are mounted on both sample and reference ports of a Labsphere™ (model 60MM RSA ASSY) integrating sphere. The baseline correction is performed for the spectral range from 200-1200 nm with no sample in either the sample or reference entrance ports. The slit width and spectral resolution are 2 nm and the spectrum was acquired with 1 nm/point. The film sample is then mounted in the sample port at a 90 degree incidence angle to the sample beam. Multiple films are measured after the acquisition of the baseline correction after the instrument was initialized.

Fluoropolymers themselves generally have excellent resistance to sunlight degradation, chemical attack, water absorption and solvents. As used herein, a "fluoropolymer" refers to a polymer derived from ingredients comprising one or more monomers, wherein at least one of the monomers includes at least one pendant F substituent. A material comprising at least one pendant F substituent may be referred to as being fluorinated.

Fluoropolymers may be homopolymers or copolymers. As used herein, the term "copolymer" refers to a polymer derived from two or more different kinds of monomers. Thus, the term "copolymer" encompasses dipolymers, tripolymers, tetrapolymers, pentapolymers, etc. Note that the term "monomer" encompasses materials that can provide polymer growth from two or more sites. Thus a monovalent moiety such as alkyl, perfluoro alkyl, OH, alkoxy, perfluoroalkoxy, etc. are not considered to be monomers for purposes of the present invention. The term "homopolymer" refers to a polymer that is derived at least substantially, and preferably entirely, from a single monomer.

Examples of useful fluorinated monomers include tetrafluoro ethylene (TFE), hexafluoropropylene (IFP), chlorotrifluoroethylene (CTFE), trifluoroethylene, hexafluoroisobutylene, perfluorobutyl ethylene, vinylidene fluoride, vinylfluoride, perfluoro (propyl vinyl ether) (PPVE), perfluoro (ethyl vinyl ether) (PEVE), perfluoro(methyl vinyl ether) (PMVE), perfluoro-2,2-dimethyl-1,3-dioxole (PDD) and perfluoro-2-methylene-4-methyl-1,3-dioxolane (PMD) among many others. If the content is limited as described below, vinylidene fluoride (VDF) also may be used as a fluorinated monomer.

If nonfluorinated monomers are used to prepare a fluoropolymer, the amount used should be limited so that the copolymer retains the desired properties of the fluoropolymer, e.g., weather resistance, solvent resistance, barrier properties, combinations of these, and/or the like. Accordingly, in some illustrative embodiments, fluorinated monomers constitute at least about 10 mole %, preferably at least about 50 mole %, of the fluoropolymer based on the total moles of monomers incorporated into the fluoropolymer.

An exemplary fluoropolymer may include a polymer, a polymer blend or a copolymer including one or more of the above monomers, such as, for example, fluorinated ethylene propylene (FEP), ethylene-tetrafluoroethylene (ETFE), poly tetrafluoroethylene-perfluoropropylvinylether (PFA), poly tetrafluoroethylene-perfluoromethylvinylether (MFA), poly tetrafluoroethylene (PTFE), ethylene chlorotrifluoroethylene (ECTFE), polychlorotrifluoroethylene (PCTFE), or tetrafluoroethylene-hexafluoropropylene-vinylidene fluoride (THV). In a further exemplary embodiment, the fluoropolymer may be a copolymer of an alkene monomer with a fluorinated monomer, such as Daikin™ EFEP by Daikin America, Inc. Fluoropolymers also include one or more acrylic and/or methacrylic polymers containing perfluoroalkyl groups as described, for example, in U.S. Pat. Nos. 5,547,558, 4,566,755, 4,732,941, 4,500,694, 4,742,140, 4,609,715 and 4,569,871. Suitable copolymers incorporating vinyl fluoride are described by U.S. Pat. Nos. 6,242,547 and 6,403,740. If the amount is limited as described below, polyvinylidene fluoride (PVDF) or a PVDF copolymer, such as vinylidene fluoride/hexafluoropropylene copolymer, may be used.

The amount of fluoropolymer(s) incorporated into the fluoropolymer compositions can vary over a wide range. In illustrative embodiments, the total amount of fluoropolymer(s) constitute from about 90 to about 99.9% by weight, preferably from about 95 to about 99.5% by weight, more preferably from about 98 to about 99% by weight of the fluoropolymer composition not including any solvent(s).

In addition to one or more fluoropolymers, the fluoropolymer compositions may include one or more other kinds of resins. For instance, blends of at least one fluoropolymer and one or more alkyl(meth)acrylates polymers could be used. Typically, these blends can comprise 50-70% by weight of fluoropolymer(s) and 30-50% by weight of alkyl(meth)acrylate polymer(s). Such blends may contain compatibilizers and other additives to stabilize the blend. Exemplary blends are described in U.S. Pat. Nos. 3,524,906; 4,931,324; and 5,707,697.

The fluoropolymers employed as part of the ultraviolet light absorbing material of the invention are commercially available or may be prepared using polymerization methods known in the art. Detailed information on polymer preparation may be found, for example, in the Encyclopedia of Polymer Science and Engineering, 2nd Ed., Vols. 16 and 17, John Wiley & Sons, 1989.

It has been observed that fluoropolymer compositions comprising too much content derived from vinylidene fluoride (VDF) may have a tendency to discolor or otherwise degrade upon aging that involves exposure to UV light. The discoloration can unduly impair the visible light transmittance of films made from the fluoropolymer compositions. This can be problematic in optoelectronic applications where the loss of light transmittance can reduce the amount of light captured for photovoltaic functionality. Discoloration or other degradation associated with VDF content can also result in an undue loss of UV protection for underlying layers whose weatherability is protected at least in part by the fluoropolymer film.

Without wishing to be bound, a possible theory to explain the discoloration/degradation problem associated with undue VDF content can be suggested. It is believed that the residues of VDF incorporated into the fluoropolymer content are reactive with basic moieties on a UVLA compound (defined below) and/or a HTA compound (defined below). The tertiary amine moiety of a HTA compound, for instance, may be an example of a moiety that is reactive with VDF residues. The reaction is believed to cause scission of the fluoropolymer and/or modification of the UVLA compound(s) or HTA compound(s) in a way that undermines UV protection. This theory is supported by data showing that the discoloration/degradation is substantially avoided when fluoropolymer composition includes no VDF content.

Accordingly, the VDF content of the fluoropolymer(s) incorporated into the fluoropolymer composition desirably is limited sufficiently to avoid undue risk of discoloration or degradation associated with the VDF content. In exemplary embodiments, less than about 10 weight percent, preferably less than about 5 weight percent, more preferably less than about 1 weight percent, and even more preferably substantially 0 weight percent of the fluoropolymer content incorporates residues of VDF based on the total weight of fluoropolymer(s) included in the composition.

With limiting VDF content in mind, more preferred fluoropolymers include terpolymers of ethylene, tetrafluoroethylene, and hexafluoropropylene (EFEP), poly(tetrafluoroethylene-alt-ethylene) (ETFE), poly(tetrafluoroethylene-co-hexafluoropropylene) (FEP), copolymers of tetrafluoroethylene and perfluoromethyl vinyl ether (MFA), copolymers of perfluoro(alkyl vinyl ether) (PFA); combinations of these and the like.

The UV protection component is provided to help protect against UV exposure. Generally, the UV protection component helps to prevent or reduce various adverse effects caused at least in part by exposure to ultraviolet light. Examples of such effects include oxidation, chain scission, recombination reactions, and cross-linking reactions. Materials suffering from one or more of these effects are said to be "weathered" due to exposure to ultraviolet light. Weatherability refers to the ability of a material to resist this weathering. In many instances, UV protection compounds help to dissipate the absorbed light energy from UV exposure as heat by mechanisms such as reversible intramolecular proton transfer. This reduces the damage caused by absorption of UV rays and hence reduces the rate of weathering.

The total amount of the UV protection component included in the fluoropolymer composition can vary over a wide range. Generally, if too much is used, it may be more difficult to avoid migration or other instability of the protection ingredients. The transmittance of the film also may be reduced and/or haze may be increased. Transmittance and haze are concerns in those modes of practice in which light transmittance without undue hazing is important. On the other hand, if too little of the UV protection component is used, the degree of UV protection may be less than desired. Balancing such concerns, exemplary fluoropolymer compositions include from about 0.1 to about 10 weight percent, preferably about 0.2 to about 5 weight percent, more preferably about 0.2 to about 2 weight percent of the UV protection component based on the total weight of the fluoropolymer composition.

The UV protection component includes at least one hindered tertiary amine (HTA) compound and at least one UV light absorbing (UVLA) compound. In the practice of the present invention, an HTA compound refers to a compound that comprises at least one tertiary amine and is free of primary and secondary amine moieties. The hindered tertiary amines may not directly absorb or protect against UV exposure themselves. However, without wishing to be bound, it is believed that an HTA compound helps to stabilize dispersion or dissolution of an UVLA compound in a fluoropolymer matrix. In other words, it is believed that the HTA compound(s) help to make the UVLA compound(s) more stable in the fluoropolymer(s) and/or other ingredients of a fluoropolymer composition.

Hindered with respect to an HTA compound means that the nitrogen atom of the tertiary amine is in a crowded steric environment. A nitrogen atom of a tertiary amine moiety is deemed to be in a crowded steric environment if at least one, and preferably at least 2 carbon atoms adjacent the amine nitrogen comprise at least two, preferably three, substituents other than H.

Figure 2:
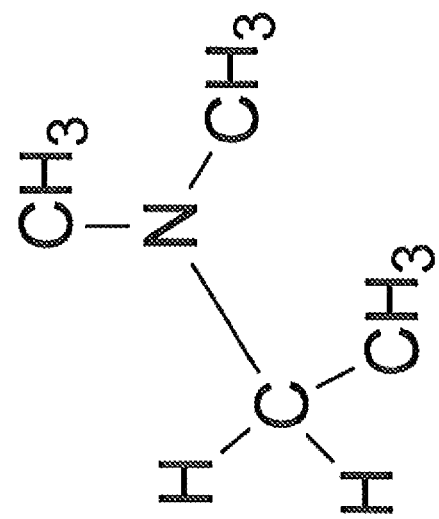
FIG. 2 shows an example of another amine that is not hindered.
Figure 3:
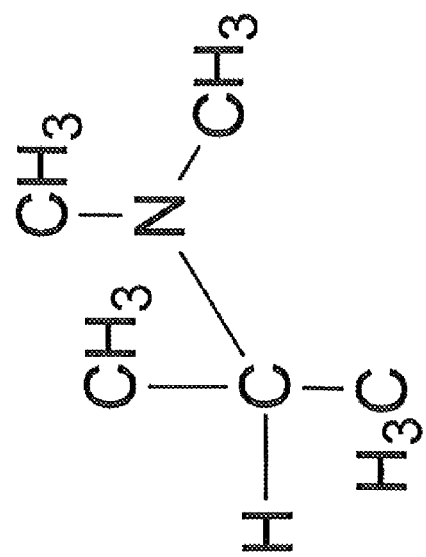
FIG. 3 shows an example of a hindered amine.
Figure 4:
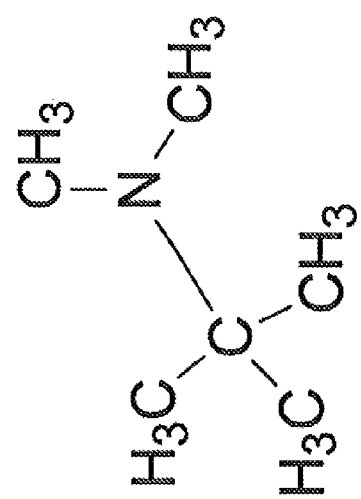
FIG. 4 shows an example of a hindered amine.
Figure 5:
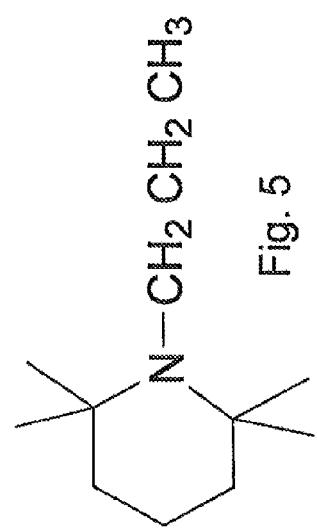
FIG. 5 shows an example of a hindered amine.

FIGS. 1-5 schematically illustrate exemplary structures that show when a tertiary amine is hindered. The tertiary amine of FIG. 1 is not hindered. All three C atoms adjacent to the amine nitrogen include three hydrogen substituents. The tertiary amine of FIG. 2 is not hindered. Although one of the adjacent C atoms has a methyl substituent, the other two substituents of this C atom are H. The tertiary amine of FIG. 3 is hindered. One of the adjacent C atoms has two methyl substituents and only one H substituent. The tertiary amine of FIG. 4 is even more hindered. All three substituents of an adjacent C atom are methyl. That C atom has no H substituents. The tertiary amine of FIG. 5 is even more hindered. Two of the adjacent carbons are co-members of a ring structure. Further, each of these two adjacent carbon atoms includes two additional methyl substituents. Neither of these two C atoms has any H substituents.

The weight average molecular weight of the HTA compound desirably is sufficiently high to promote stable dispersion of the HTA compound in the fluoropolymer composition and to avoid undue migration. Generally, stability increases and a tendency to migrate is reduced with increasing molecular weight. In illustrative embodiments, the HTA compound has a weight average molecular weight of at least about 1000, preferably at least about 3000, more preferably at least about 5000.

On the other hand, if the size of the HTA compound is too big, it may be more difficult to disperse the HTA compound in the fluoropolymer composition. Undue phase separation might also occur, reducing the light transmittance of the composition in those embodiments in which light transmittance is desired. Accordingly, in illustrative embodiments, the weight average molecular weight of the HTA compound desirably is less than about 150,000, preferably less than about 100,000, more preferably less than about 60,000.

If the HTA compound contains too much amine functionality that is primary or secondary, it has been observed that fluoropolymer compositions may have a tendency to discolor or otherwise degrade upon aging that involves exposure to UV light. Without wishing to be bound, a possible theory to explain the discoloration/degradation problem associated with undue primary or secondary amine content can be suggested. It is believed that the primary or secondary amine functionality may undergo nucleophilic reactions with the fluoropolymer(s). This theory is supported by data showing that the discoloration/degradation is substantially avoided when the primary and secondary amine content of the HTA compound(s) and UVLA compound(s) is limited.

Accordingly, the primary and secondary amine content of the HTA and UVLA compound(s) incorporated into the fluoropolymer composition desirably is limited sufficiently to avoid undue risk of discoloration or degradation associated with the primary and secondary amine content. In exemplary embodiments, less than about 10 molar percent, preferably less than about 5 weight percent, more preferably less than about 1 weight percent, and even more preferably substantially 0 weight percent of the total amine content of the UVLA protection and HTA compounds is primary or secondary based on the total moles of amine moieties included in the composition.

A preferred class of HTA compounds are those that comprise a cyclic moiety wherein at least one nitrogen atom of at least one tertiary amine moiety is a backbone constituent of the cyclic moiety. This provides a structure in which (1) the N atom of the amine is bonded to first and second adjacent cyclic backbone atoms on each side of the nitrogen and (2) a substituent other than H also is pendant from the nitrogen so that the cyclic moiety is N-substituted. The pendant N-substituent may be monovalent or a member of a ring structure.

Figure 6:
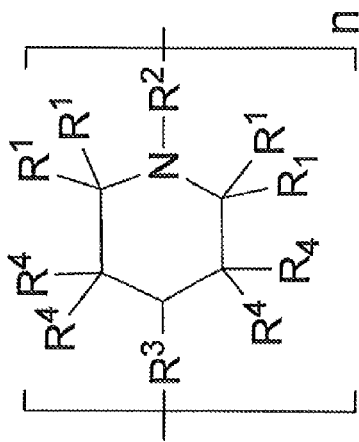
FIG. 6 schematically shows the structure of preferred HTA compounds.

Exemplary compounds having this N-substituted cyclic structure are shown in FIG. 6, wherein each R1 independently is a linear, branched, or cyclic aliphatic or aromatic monovalent moiety other than H or is a co-member of a ring structure and preferably is alkyl or alkoxy of 1 to 4 carbon atoms; R2 is an aliphatic or aromatic divalent moiety that may be straight, branched, or cyclic and preferably comprises at least one ether, ester, and/or imide moiety; R3 is O, S, or independently a divalent moiety according to the definition of R2; each R4 independently is H or a monovalent or co-ring member according to the definition of R1; and n has a value such that the weight average molecular weight of the compound is at least about 1000, preferably at least about 3000, more preferably at least about 10,000. In many embodiments, n has a value such that the weight average molecular weight of the compound is less than about 150,000, preferably less than about 100,000, more preferably less than about 80,000. Any of R1, R2, R3, and/or R4 independently may include on or more tertiary amine moieties.

Figure 7:
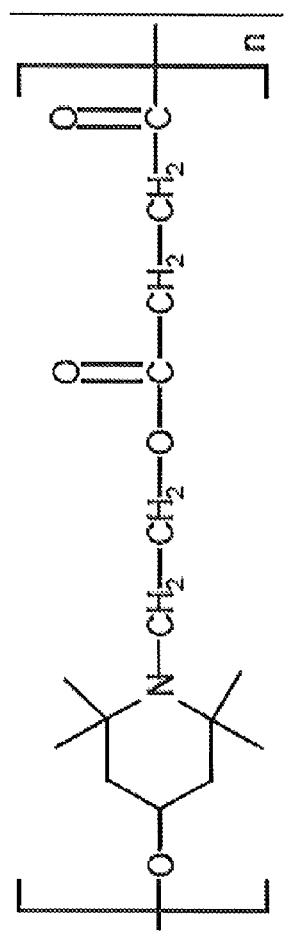
FIG. 7 shows the structure of a preferred HTA compound.

FIG. 7 shows a particularly preferred embodiment of a compound having the structure shown in FIG. 6. In this compound, n has a value such that the compound has a number average molecular weight of about 3100 to about 4000. In addition to helping to stabilize UVLA compound(s) in the fluoropolymer compositions, this compound also advantageously has antioxidant characteristics. It is believed that other similar compounds such as those having a structure according to FIG. 6 also might exhibit antioxidant characteristics.

In addition to the HTA compound, the UV protection component further includes at least one UV light absorbing (UVLA) compound, wherein the at least one UVLA compound is free of primary and secondary amine functionality and wherein the at least one UVLA compound has a weight average molecular weight that is greater than about 500.

UVLA compounds are compounds that singly or by combinations help to prevent or reduce various adverse effects caused by exposure to ultraviolet light. Examples of such adverse effects include one or more of oxidation, chain scission, uncontrolled recombinations, and cross-linking reactions. Ultraviolet exposure causes some of these adverse effects by photo-oxidation mechanisms. Materials are considered to get weathered due to exposure to ultraviolet light. Weatherability refers to the ability of a material to resist this weathering. In many instances, UVLA compounds help to dissipate the absorbed light energy from LTV exposure as heat by reversible intramolecular proton transfer. This reduces the absorption of UV rays and hence reduces the rate of weathering.

Often, a particular UVLA compound exhibits a peak absorbance for UV light at a particular wavelength, which has been termed as the peak absorbtivity wavelength for that compound. Consequently, a plurality of UVLA compounds that offer a range of peak absorbance characteristics may be used. This could help increase the overall cross-section for capturing UV energy for enhanced UV protection.

A wide range of UV protection materials can be used singly or in combination as the UVLA compound(s). An exemplary class of UVLA compounds includes benzophenone type compounds. These materials generally comprise at least one substituted benzophenone moiety comprising one or more pendant substituents. Combinations of such substituents may be co-members of a ring structure in some embodiments. An exemplary benzophenone type compound having a weight average molecular weight of about 50,000 is commercially available under the trade designation Cyasorb UV 2126 from Cytec Industries, Inc.

Another exemplary class of UVLA compounds includes benzotriazole type compounds. These materials generally comprise at least one substituted benzotriazole moiety comprising one or more pendant substituents. Often, these materials are N-substituted. In some instances, multiple benzotriazole moieties are linked via a linking group. An exemplary compound of this type has a molecular weight of about 659 g/mol and is commercially available under the trade designation Tinuvin 360 from BASF.

Another exemplary class of DVLA compounds includes triazine type compounds. These materials generally comprise at least one substituted triazine moiety comprising one or more pendant substituents. The triazine moiety may be a substituted 1,2,3-triazine, a substituted 1,2,4-triazine, and/or a 1,3,5-triazine. Presently, compounds comprising a substituted 1,3,5-triazine are preferred. One exemplary compound of this type has a molecular weight of about 654 g/mol and is commercially available under the trade designation Tinuvin 400 from BASF. Another exemplary compound of this type has a molecular weight of about 509 g/mol and is commercially available under the trade designation Cyasorb UV 1164 from Cytec Industries.

Another exemplary class of UVLA compounds includes oxalanilide type compounds. These materials generally comprise at least one substituted oxalanilide moiety comprising one or more pendant substituents. Other types of UVLA compounds having a molecular weight of at least about 500 also are suitable. One class of such materials comprises a combination of a plurality of aromatic moieties, a plurality of nitrile moieties, a plurality of carbon-carbon double bonds, and a plurality of ester linkages. An exemplary compound of this type has a weight average molecular weight of about 1060 g/mol and is commercially available under the trade designation Uvinul 3030 from BASF.

The weight ratio of the total weight of UVLA compound(s) to the total weight of HTA compound(s) may vary over a wide range. In illustrative embodiments, the weight ratio of the UVLA compound(s) to the HTA compound(s) is in the range from about 1:50 to about 50:1, more preferably about 1:10 to about 10:1, and more preferably from about 1:5 to about 5:1. In one illustrative embodiment, using 1 g of Tinuvin 622 (BASF) HTA compound per 1 g of Tinuvin 400 (BASF) UVLA compound would be suitable.

The weight average molecular weight of the UVLA compound desirably is sufficiently high to promote stable dispersion of the UVLA compound in the fluoropolymer composition and to avoid undue migration. Note that weight average molecular weight generally correlates with the size of the molecule. Generally, stability increases and tendency to migrate is reduced with increasing molecular weight. In illustrative embodiments, the UVLA compound has a weight average molecular weight of at least about 500, preferably at least about 1000, more preferably at least about 1500.

Subject to practial concerns, there otherwise generally is no upper limit on the molecular weight of UVLA compounds that are suitable. If the miscibility of the UVLA compound in the composition is reasonably good, the impact of high molecular weight is minimal and even de minimis. With this in mind, many exemplary embodiments of UVLA compounds would have a weight average molecular weight of about 200,000 or less, preferably 150,000 or less, or even about 100,000 or less.

The following table shows molecular weight and melting point characteristics for exemplary commercially available UVLA compounds:

TABLE 1

Molecular weight and melting point of exemplary UV absorbers

| Materials | Melting point ° C. | MW, g/mol |
|---|---|---|
| CYASORB UV 2126 | 85-95 | 50,000 |
| Tinuvin 360 | 195 | 659 |
| Tinuvin 400 | — | 654 |
| CYASORB UV1164 | 88-91 | 509 |
| Uvinul 3030 | 178 | 1060 |

In addition to the fluoropolymer, optional resins, and the UV protection component, the fluoropolymer composition may include one or more other ingredients as desired. Examples of such additives include one or more waxes, lubricants, antioxidants, preservatives, plasticizers, fillers, bactericides, fungicides, other stabilizers, anti-slip agents, combinations of these, and the like. These can be used in accordance with conventional practices known or hereafter known to those skilled in the art.

The fluoropolymer coating compositions may be provided in fluid form as a solution or dispersion. The fluid embodiments can be used to form films or coatings using a variety of fabrication methods, including casting, blowing, dipping, extruding, co-extruding, calendering, curtain coating, brushing, spin coating, spraying, gravure coating, knife coating, other coating methods, and/or the like. Resultant films and coatings can be coated and cured in situ, pre-formed and then laminated onto a substrate, formed into roll stock for later use, or the like.

The fluoropolymer compositions of the present invention can be used to make a variety of single and multi-layer films and coatings. If the fabrication has multiple layers, the fluoropolymer compositions may be included in at least one of the layers.

Fluoropolymer composition embodiments in the form of solutions or dispersions may be prepared by mixing the ingredients of the composition with one or more suitable solvents. The polymer concentration in these solutions or dispersions is selected to achieve a workable viscosity of the solution and tends to vary with the particular polymer, the other components of the composition, and the process equipment and conditions used. Preferably, the fluoropolymer content of solutions is from about 10 wt % to about 25 wt % based on the total weight of the solution. For dispersions, the fluoropolymer content is preferably in the range from about 25 wt % to about 50 wt % based on the total weight of the dispersion.

To form coatings on a substrate, the wet solution or dispersion is caused to solidify via physical (e.g., drying) and/or chemical (e.g., crosslinking) mechanisms to remove the solvent and coalesced thermally if necessary to form the fluoropolymer coating on the substrate film. With some compositions in which the fluoropolymer is in solution form, the compositions can be coated onto substrate films and allowed to air dry at ambient temperatures. Although not necessary to produce a coalesced film, heating is generally desirable to dry the coating more quickly. Drying temperature often are in the range of about 25° C. (ambient conditions) to about 200° C. (oven temperature—the film temperature will be lower). When the fluoropolymer in the composition is in dispersion form, it is often desirable not only for the solvent to be removed but also for the fluoropolymer to be heated to a sufficiently high temperature that the fluoropolymer particles coalesce into a continuous coating. Preferably, fluoropolymer in the coating is heated to temperature of about 150° C. to about 250° C. to accomplish this. The solvent used preferably aids in coalescence, i.e., enables a lower temperature to be used for coalescence than would be necessary with no solvent present.

A useful technique for preparing fluoropolymer compositions suitable for coating applications may involve pre-dispersing or pre-dissolving the UV protection component and optionally other ingredients in a suitable liquid carrier. As an additional option, a portion of the fluoropolymer content may be included in the pre-admixture. The pre-admixture is then blended with the remaining fluoropolymer content with heating to prepare a suitable coating composition. This kind of mixing approach is further described in U.S. Pat. No. 7,553,540. UVLA and HTA compounds also can be dispersed in fluoropolymer compositions by swelling the fluoropolymer(s) in solution according to U.S. Pat. No. 5,582,653.

Film or coatings also may be prepared from melted blends of the composition ingredients using little or no solvent. For instance, a coating or film may be prepared by blending a melt of the fluoropolymer content with a melt of the UV protection component, optionally with one or more other ingredients as desired. Blending typically until the molten mixture is uniform. After uniformity is achieved, the mixture may be pressed, extruded, co-extruded, calendered, or otherwise formed into a film using methods known in the art.

In one mode of practice, a melt blend is obtained by compounding the fluoropolymer component, UV protection component, and optional ingredients (if any) using a Haake Polylab system (Model Rheomix-600 with roller blade rotors at B 1470, Freeport) operated at 60 rpm at 220° C. for 5 min followed by a quick cooling using a compression molder to produce about 3 mm thick slabs. Optionally, this may be followed by compression molding. The initially pressed slabs are cut into suitable size samples, e.g., about 0.5×0.5 inch pieces, using a New Hermes Shearer. The pieces are placed between Teflon films to make flash moldings. About 4 pieces were positioned 2-3 mils apart and pressed using a 230° C. preheated Carver press. The molding conditions were 3000 lb for 3 min, then 10,000 lb for 3 min, then and 20,000 lb for 2 min followed by a quenching on another press stage at 3000 lb and ambient temperature for 3 min.

In other modes of practice, film embodiments may be fabricated using casting techniques. For instance, the ingredients are melt-extruded at about 230° C. using a cast roll speed of about 15 feet per min. Films having a variety of widths and thicknesses can be made this way. In one embodiment, the collected cast film had a width of about 8 inches and a thickness of about 2 to 3 mils.

The fluoropolymer compositions of the present invention are useful in a wide range of applications. The compositions have characteristics that are particularly useful to help protect and/or isolate substrates from the environment. When used for protection, the compositions can form protective barriers around all or portion(s) of a substrate. By way of example, the protective films are useful with respect to optoelectronic devices such as flexible photovoltaic modules or light emitting diodes particularly organic light emitting diodes, retroreflective articles or sheeting, luggage, motor vehicles, aircraft, marine vessels, vinyl siding and other architectural surface treatments, and the like.

Fluoropolymer coated films made in accordance with the invention are especially useful in optoelectronic devices incorporating any of a variety of semiconducting materials, including germanium, silicon carbide, silicon germanium, germanium arsenide, germanium nitride, germanium antimonide, germanium phosphide, aluminum arsenide, aluminum nitride, aluminum antimonide, aluminum phosphide, boron arsenide, boron nitride, boron phosphide, indium arsenide, indium nitride, indium antimonide, indium phosphide, aluminum gallium arsenide, indium gallium arsenide, indium gallium phosphide, aluminum indium arsenide, aluminum indium antimonide, copper oxide, copper indium gallium, copper indium gallium selenide, copper indium gallium sulfide, copper indium gallium sulfide selenide, Aluminium gallium indium phosphide, Aluminium gallium arsenide phosphide, Indium gallium arsenide phosphide, Indium gallium arsenide antimonide, Indium arsenide antimonide phosphide, Indium arsenide antimonide phosphide, Aluminium indium arsenide phosphide, Aluminium gallium arsenide nitride, Indium gallium arsenide nitride, Indium aluminium arsenide nitride, gallium arsenide, Gallium arsenide antimonide nitride, Gallium indium nitride arsenide antimonide, Gallium indium arsenide antimonide phosphide, Cadmium selenide, Cadmium sulfide, Cadmium telluride, Zinc oxide, Zinc selenide, Zinc sulfide, Zinc telluride, Cadmium zinc telluride, Mercury cadmium telluride, Mercury zinc telluride, Mercury zinc selenide, Cuprous chloride, Copper sulfide, Lead selenide, Lead(II) sulfide, Lead telluride, Tin sulfide, Tin sulfide, Tin telluride, Lead tin telluride, Thallium tin telluride, Thallium germanium telluride, Bismuth telluride, Cadmium phosphide, Cadmium arsenide, Cadmium antimonide, Zinc phosphide, Zinc arsenide, Zinc antimonide, Titanium dioxide, anatase, Titanium dioxide, rutile, Titanium dioxide, Copper(I) oxide, Copper(II) oxide, Uranium dioxide, Uranium trioxide, Bismuth trioxide, Tin dioxide, Barium titanate, Strontium titanate, Lithium niobate, Lanthanum copper oxide, silicon (including polycrystalline silicon, amorphous silicon, porous silicon, strained silicon), combinations of these, and the like.

Figure 8:
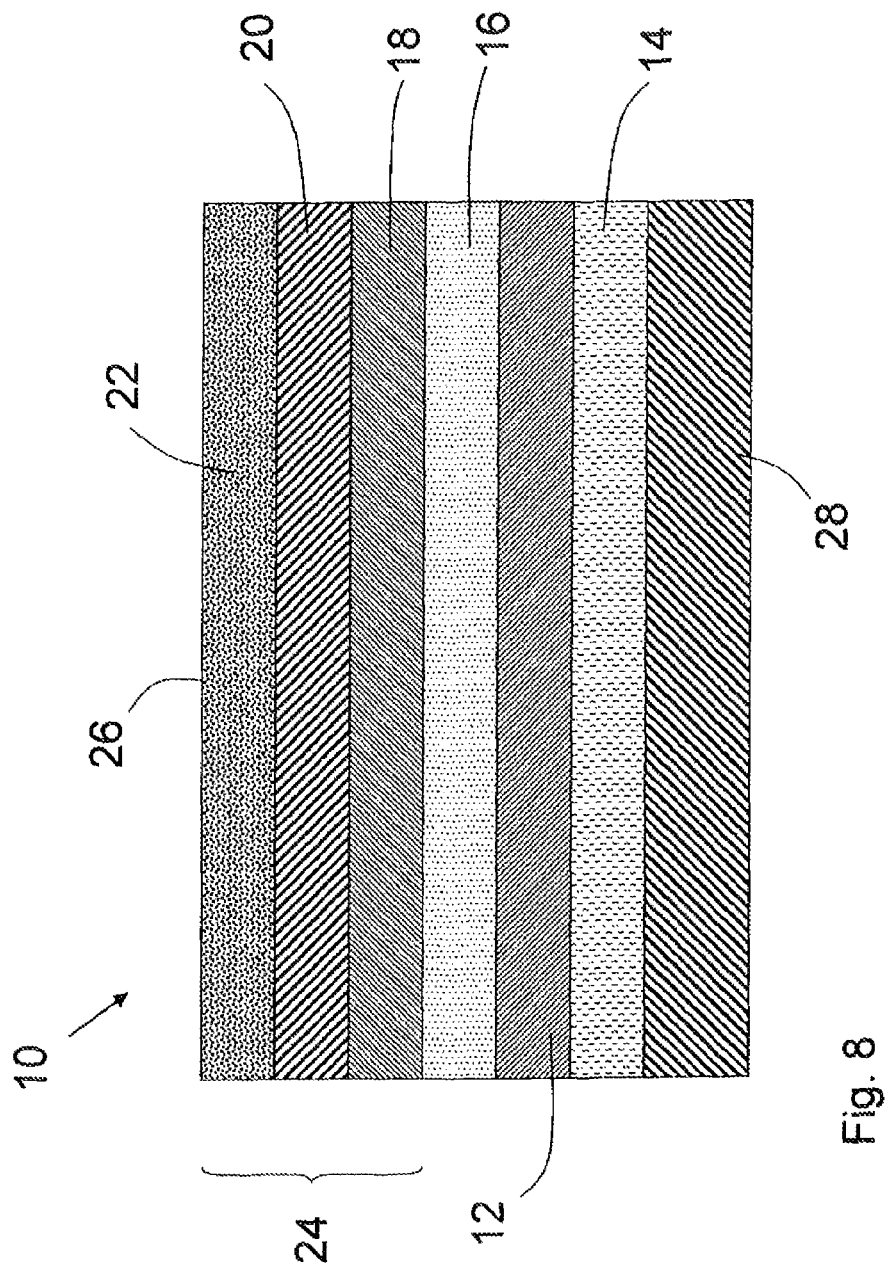
FIG. 8 schematically shows an embodiment of a photovoltaic module incorporating principles of the present invention.

In particular, the fluoropolymer compositions can be used to form protective top layers on flexible photovoltaic modules. FIG. 8 shows an exemplary embodiment of a photovoltaic module 10. Solar cell 12 can be any kind of solar cell such as one incorporating one or more of the semiconductive materials listed above. In exemplary embodiments, solar cell 12 is based on one or more semiconducting materials such as those listed herein.

Encapsulant layers 14 and 16 are used to help isolate and protect solar cell 12 from the environment. Each layer 14 and 16 independently includes elastomeric or other polymeric materials. Typical materials include one or more of ethylvinylacetate (EVA), functionalized polyolefins, polyvinylbutyral (PVB), ionomers, polymethylmethacrylate (PMMA), polyurethane, polyester, hot melt or silicone elastomers, and fluoropolymer elastomers.

Barrier layer 18 is another component that helps to isolate and protect solar cell 12 from the environment. In some embodiments, barrier layer 18 is formed from glass, organic and inorganic alternative coated multilayer films such as SiOx, AlOx coated multilayer barrier films. Further details are provided in PCT Patent Pub. Nos. WO 2007/092541 A1 and WO 2008/057045.

Adhesion layer 20 helps to adhere fluoropolymer layer 22 to optional barrier layer 18 and/or encapsulation layer 16, as the case may be. A wide range of adhesion promoting material(s) may be used to form adhesion layer 20. Examples of suitable materials include one or more of silane grafted polyolefin, polyolefin copolymer with silane containing monomer, ethylene vinyl acetate (EVA), poly(vinyl butyral), urethane elastomer, ionomer, poly(meth)acrylates, silicone rubber, combinations thereof or the like. These may be thermoplastic or thermosetting.

Backsheet 28 is a single or multilayer film that helps to protect device 10 from the environment. Often, these are pre-made sheets that are laminated into device 10. These also can be formed from coating compositions. One example of a backsheet is a PV back sheet laminate commercially available under the trade designation PROTEKT TFB from Madico Inc., Woburn, Mass., USA.

Protective layer 22 incorporates a fluoropolymer composition of the present invention. Together, barrier layer 18, adhesion layer 20, and protective layer 22 form a top sheet laminate 24. Because light to be captured is incident upon face 26, top sheet laminate 24 and its layers desirably are highly transparent to visible light.

In some embodiments, solar cell 12 is flexible. As used herein, the term "flexible" with respect to a solar cell means that the solar cell can be wound on a core of having a minimum diameter of 1 meter, more preferably a minimum diameter of 0.5 meter, and most preferably on a minimum diameter of 0.3 meter.

The fluoropolymer compositions have excellent mechanical properties. For example, when an exemplary composition is used to make a film having a thickness of about 60 micrometers, the resulting film may have an elastic modulus in the range from about 105 to 1010 Pa. Elastic modulus is measured according to ASTM D882-10 (2010).

The present invention will now be further described in relation to the following illustrative examples. In addition to test methods described elsewhere herein, the following test methods were used:

FT-IR spectra were collected using a Nexus 670 FT-IR spectrometer equipped with a Thermo-Nicolet Durascope. For each sample, spectra were collected from five different locations and averaged.

Hot water immersing aging test: Samples were placed in 85° C. DI water and removed after one month.

QUV-A test: The QUV-A test involved 12-h cycles which included 8-h UV exposure during which the temperature gradually increased first from ambient to about 70° C. and 4-h of darkness during which the temperature gradually decreased to about 50° C. The temperature change was passive due to the UV cycle. The UV light intensity was 0.72 W/m2 at 340 nm. The chamber contained an open container of water. Water evaporated from the container and condensed on the sample surfaces during the dark period when the temperature decreased. Samples dried during the UV exposure as the temperature increased.

Cyclic Xenon arc test: The xenon arc test consisted of 2 h cycles which included 90 min UV exposure followed by 30 min spraying with water without UV light. The temperature was increased from about 30° C. to 89° C. in less than 30 min during UV exposure. The relative humidity was controlled at about 50% except when water was being sprayed. UV intensity of the Xenon arc test is similar to the peak light intensity of the sun in Florida.

Example 1

The stability of UV absorbers in fluoropolymers is strongly affected by migration and degradation where degradation includes hydrolysis, oxidation, thermal and UV degradation. Generally, migration and degradation will happen together during most aging tests. Samples were evaluated by aging at 85° C. in water to assess accelerated aging conditions. It was expected that migration and hydrolysis would be important factors affecting the stability of UV absorbers in the fluoropolymers during this test. The samples are listed in Table 2:

TABLE 2

| Sample | Flouropolymer | HALS (1%) | UV Absorber (1%) | Color | Comments |
|---|---|---|---|---|---|
| A | EFEP | T662 | T400 | White | Excellent weatherability. After 2000 h QUV-A, UV block effect does not drop significantly |
| B | EFEP | T662 | UV531 | White | After 1000 h QUV-A, UV block effect decreased and transmittance increased to 40% from below 1% |
| C | EFEP | UV3529 | UV531 | Black | Blocks visible light |
| D | EFEP | Chimasorb 944 | UV531 | Black | Blocks visible light |
| E | EFEP | UV5050 | UV531 | Black | Blocks visible light |
| F | PVDF | T662 | UV531 | White | After 1000 h QUV-A, UV block effect decreased and UV transmittance increased to 50% from below 1% |
| G | PVDF | T662 | UV3030 | White | After 1000 h QUV-A, good UV block effect, while visible light transmittance dropped significantly |
| H | PVDF | UV5050 | UV531 | Deep black | Blocks visible light |
| I | EFEP | — | Tinuvin 400 | White | After 1000 h QUV-A, UV block effect decreased, and UV transmittance increased to 40% from around 1% |

TABLE 2-continued

| Sample | Flouropolymer | HALS (1%) | UV Absorber (1%) | Color | Comments |
|---|---|---|---|---|---|
| J | EFEP | — | Tinuvin 400DW | White | After 1000 h QUV-A, UV block effect decreased, and UV transmittance increased to 25% from around 1% |
| K | PVDF | — | Tinuvin 328 | White | After 1000 h QUV-A, UV block effect decreased, and UV transmittance increased to 70% from around 1% |
| L | PVDF | — | Tinuvin 312 | White | After 1000 h QUV-A, UV block effect decreased, and UV transmittance increased to 70% from around 1% |
| M | PVDF | — | UV531 | White | After 1000 h QUV-A, UV block effect decreased, and UV transmittance increased to 70% from around 1% |

The results of UV-vis transmittance measurements at 350 nm before and after aging in 85° C. water of the samples in Table 2 are evaluated. At 350 nm, pure PVDF and EFEP have more than 90% transmittance, confirming that both fluoropolymers have good UV transparency. After 1 month of aging in 85° C. water, the PVDF samples that contained UV532, Tinuvin 312 and Tinuvin 328 UVLA compounds (all have relatively lower molecular weight) had a significant increase in transmittance at 350 nm, indicating either that the UV absorber may have migrated out of the sample and/or decomposed during the aging test. However, the UV absorption of most other samples did not show significant changes. This indicates hydrolytic stability in this aging test. The migration of immiscible UV additives in fluoropolymers might begin with vapor state diffusion through pores, and therefore the additives with lower molecular weight would be expected to migrate fast. The vaporized UV additives might diffuse through the pores in the fluoropolymers (the pores could be generated by immiscible UV additives itself) and eventually transport to the film surface. These might form a layer of additive or completely evaporate into the air depending on the diffusion rate to and from the surface.

Example 2

The test results of this example suggest that UV and water exposure together have a significantly greater detrimental influence on the ability of the films with UV additives to block UV light than water exposure alone. In the QUV and Xenon arc aging chambers, the UV radiation combined with water and high temperature increased the rates of both migration and decomposition, and hence the ability of the films to block UV light.

Figure 9B:
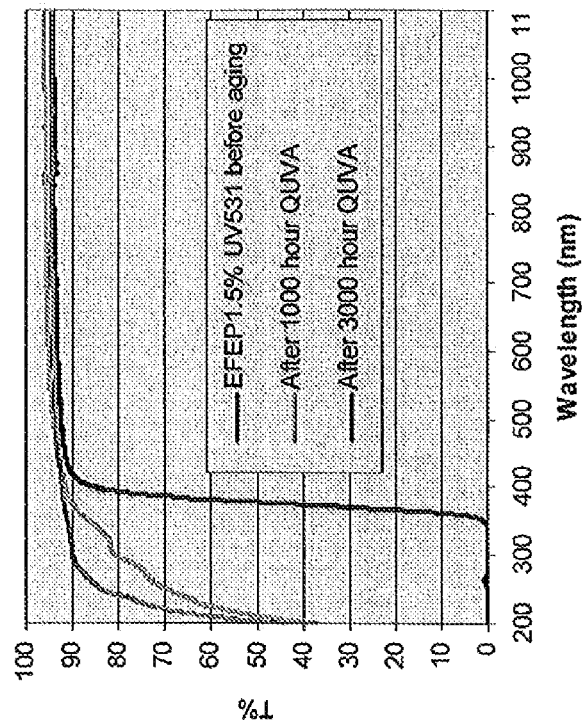
FIGS. 9A and 9B are graphs showing transmittance as a function of wavelength for samples of Example 2 before and after aging.
Figure 9A:
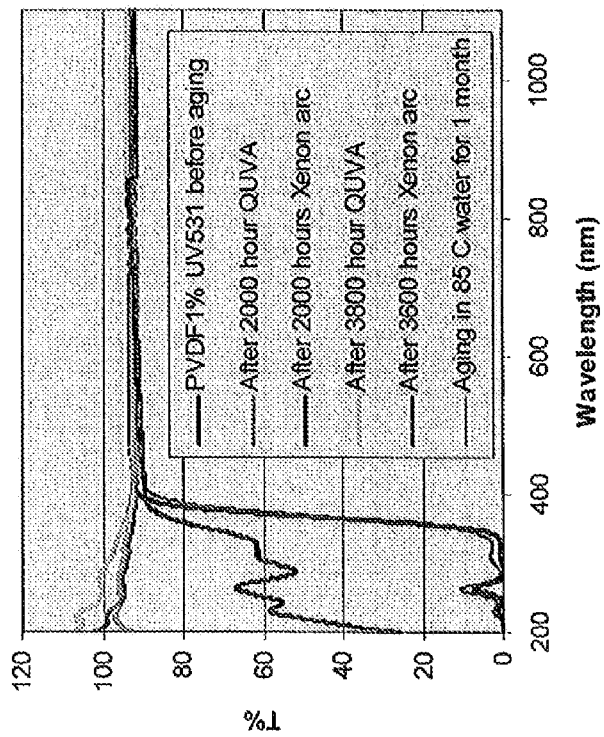

FIGS. 9A and 9B show UV-vis spectra of UV531 in PVDF (9A) and EFEP (9B) before and after aging. A comparison with the 85° C. water aging is also shown in FIG. 9A. The UV blocking ability still remained after 85° C. water aging, but was lost after UV aging. The UV blocking ability almost completely disappeared after 1000 hours for EFEP and after 2000 hours for PVDF. This reveals that UV 531 either migrated and/or decomposed completely during aging. In order to determine the major mechanism(s) for loss of UV blocking, PVDF 1% UV531 films with and without 2000 h QUVA aging were analyzed by FTIR. The samples were masked so only the center area was exposed to UV. From the FTIR spectra, $CH_2$ stretches at 2924 and 2853 $cm^{-1}$ and bands at 1625 and 1576 $cm^{-1}$ due to UV 531 additive were strongest in un-aged pure PVDF sample and weakest in the center area of the aged sample. Spectra of the aged sample center and the control pure PVDF sample were nearly the same, indicating that UV 531 completely migrated or decomposed during QUV-A aging. The bands corresponding to UV 531 did not disappear in the FTIR curve associated with the edge of the sample. However, the intensity of those bands decreased significantly.

It seems that UV radiation facilitated migration and decomposition of UV 531 in the PVDF during aging. After QUV-A aging, the center of the PVDF/1% UV531 film became darker and transmittance in the visible range decreased a few percent. UV 531 appears to be involved in a chemical reaction with the PVDF matrix during UV radiation aging because changes of the color and the transmittance was not observed in EFEP/1% UV 531 film before and after the aging.

Example 3

Figure 10:
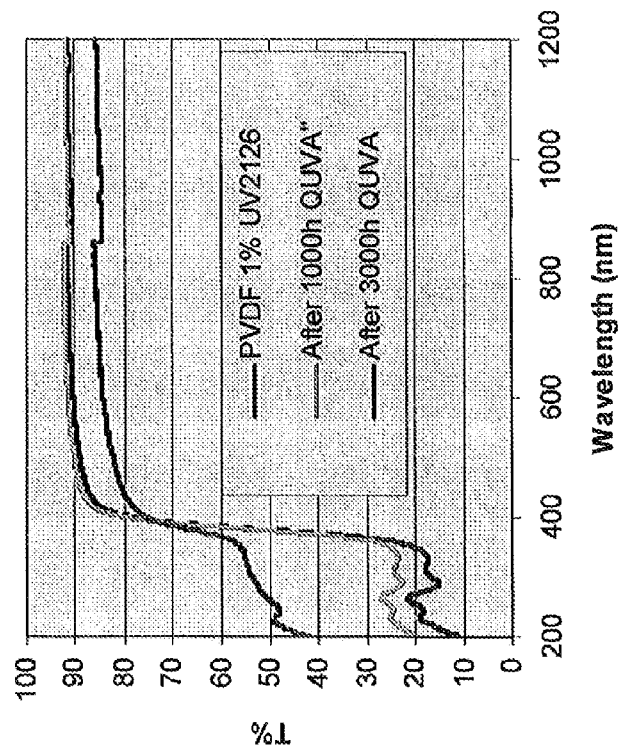
FIG. 10 is a graph showing transmittance as a function of wavelength for samples of Example 3.

UV 2126 is a polymerized UV absorber with a MW of 50,000 g/mol. FIG. 10 shows the UV-vis spectra of 1% UV2126 in PVDF before and after QUVA testing. The data in FIG. 10 suggest that the stability of the high MW UV absorber was not good because some UV blocking property was lost after 1000 h of QUVA aging and significantly more was lost after 3000 h. A reasonable hypothesis is that chain cleavage of this polymerized UV additive occurred and hence migration significantly increased. It is also possible that UV2126 reacts with PVDF, oxygen or itself during UV radiation to generate colored species, as evidenced by the significant color change and the drop of the transmittance in visible range after aging.

Example 4

Figure 11:
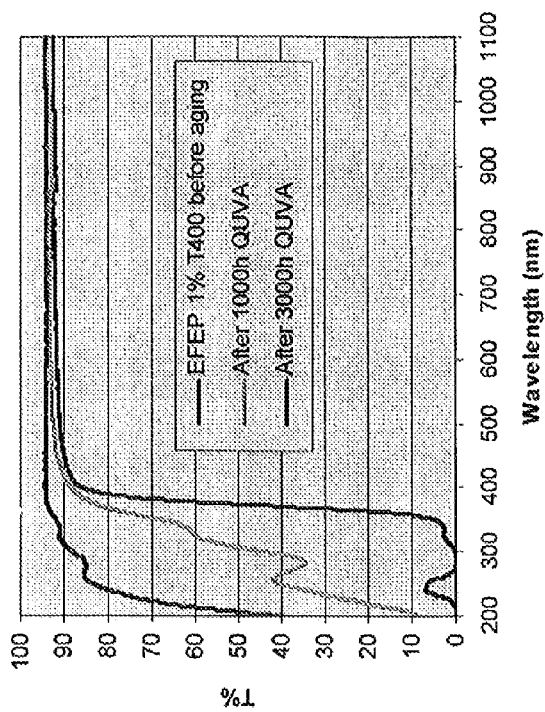
FIG. 11 is a graph showing transmittance as a function of wavelength for samples of Example 4.

The UV blocking properties of EFEP containing 1% T400 decreased significantly after only 1000 h of QUVA aging, and it almost completely disappeared after 3000 h of aging. FTIR spectra gathered at different locations on the film sample before and after aging also showed the significant change in the UV absorber concentration (FIG. 11).

An FTIR spectrum was obtained for a sample that is masked so only the center region is exposed to UV. In the FTIR spectra, the CH2 stretches at 2918 and 2849 cm$^{-1}$ and bands at 1629, 1614, 1588, and 1576 cm$^{-1}$ due to T400 almost disappeared in the center area of the film. Spectra gathered near the center and of an EFEP 5000 control sample without UV additive have nearly the same FTIR spectra indicating a complete loss of the UV absorber in EFEP. The spectra gathered near the sample's edge and of the sample before aging were similar. This demonstrated that T400 EFEP without UV radiation was quite stable after 3000 h of aging. Again, UV radiation might also induce decomposition of the T400 in EFEP, and thus increasing the migration rate.

Example 5

Figure 12B:
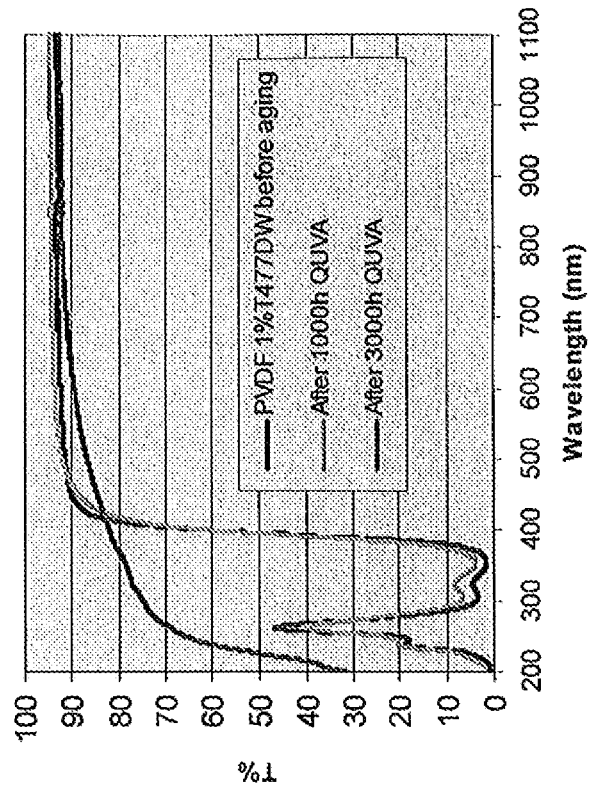
FIGS. 12A and 12B are graphs showing transmittance as a function of wavelength for samples of Example 5 before and after aging.
Figure 12A:
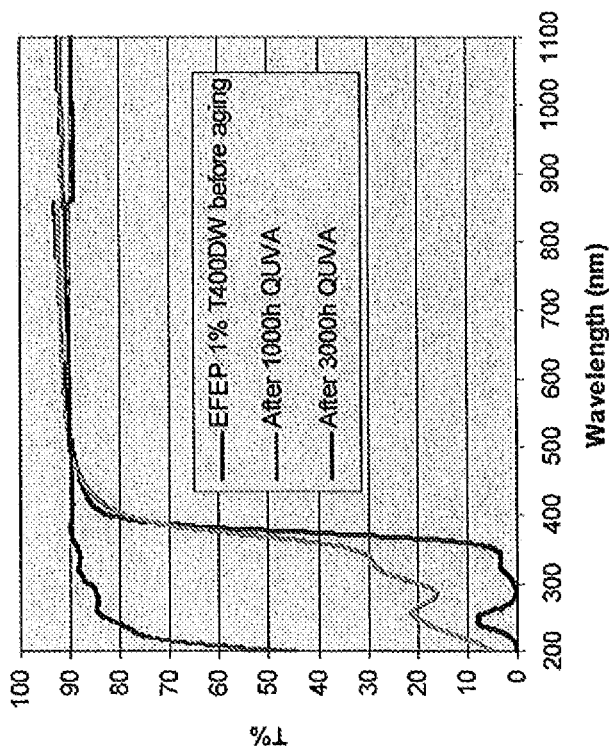

Organic nanoparticle UV absorbers are believed to not migrate in fluoropolymers because they are solid particles without even limited solubility. T400 DW and T477 DW are two grades of organic nanoparticles UV absorbers that have sizes of about 30 to 100 nm. The UV absorbers are encapsulated inside the nanoparticles by chemical bonding. FIGS. 12A and 12B respectively show the UV-vis spectra of T400DW in EFEP and T477DW in PVDF before and after the QUVA test. Neither additive offered significant UV blocking after 3000 h of exposure.

Example 6

Figure 13B:
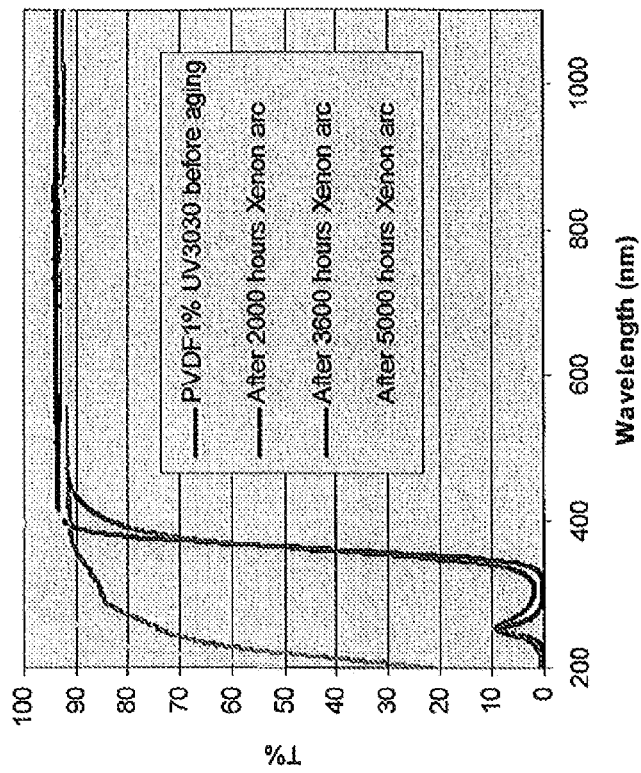
FIGS. 13A and 13B are graphs showing transmittance as a function of wavelength for samples of Example 6 before and after aging.
Figure 13A:
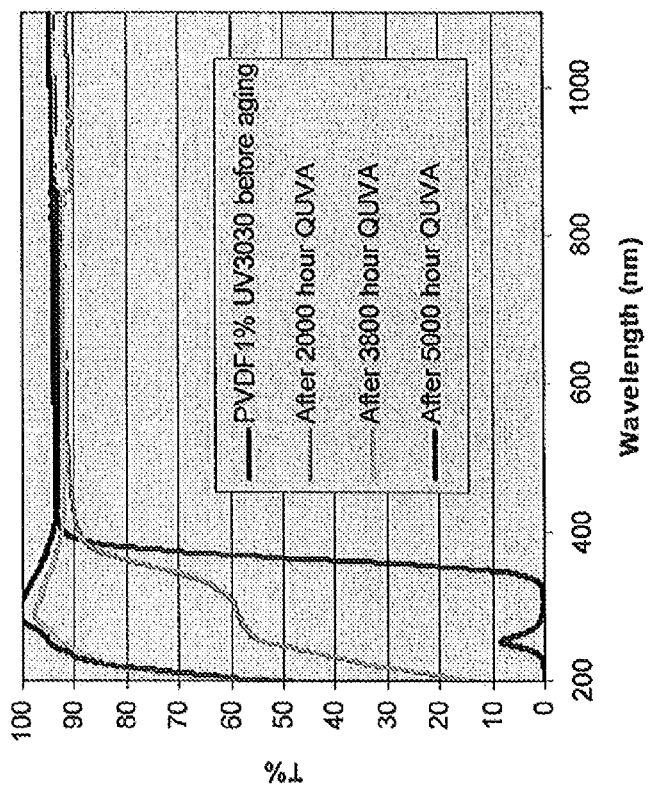

UV3030 was dispersed in PVDF as evidenced by the relatively high transmittance of visible light and low haze (Table 2 above). The high MW of UV3030 could potentially yield a low migration rate in PVDF. However, the QUVA and Xenon arc aging experiments show poor retention of UV blocking ability as shown in FIGS. 13A and 13B. FTIR analysis of the QUVA aged sample indicated the UV radiation significantly affected the stability of UV3030 in PVDF. The spectra of the un-aged sample and the edge sample were nearly the same while the spectrum taken near the sample center was different: CH$_2$ stretches at 2919 and 2849 cm$^{-1}$ and C=O stretches at 1718 cm$^{-1}$ due to the UV 3030 additive almost disappeared from the center. Spectra of the center and pure PVDF control film were nearly the same. Furthermore, the visible transmittance of the sample also decreased after aging (the sample color also became darker after aging). The aging behavior of fluoropolymers containing high molecular weight, polymerized, chemically bonded or encapsulated UV additives are all qualitatively similar in that the UV blocking is little influenced by hot water exposure alone. However, the UV exposure tests yield significant reduction of UV blocking.

Example 7

The results in previous examples demonstrate that the stability of UV absorbers by themselves was very low in the fluoropolymer matrix under UV aging. Most organic UV absorbers, no matter the form such as high MW, chemically bonded or encapsulated in nanoparticles, decomposed or migrated or both completely after a few thousands hours of QUVA or Xenon arc aging. However, without wishing to be bound by theory, an HTA compound might play an important role with respect to helping to stabilize dispersion or dissolution of the UVLA compound in the fluoropolymer composition. The fluoropolymers, HTA and UV absorbers that were compounded into films are listed in Table 3 below. UV3529 is considered as secondary amine because it contains around 0.06 wt % of un-methylated amine groups.

Conventional knowledge is that combinations of organic UV absorbers and HTA compounds added to polymers have a synergistic benefit on UV aging. But, the following data show this is not generally true for fluoropolymers. These results demonstrate that not all HTA compounds offer sufficient benefits, if any, when used in PVDF and EFEP because of discoloration. The blends became black or deep black when UV3529, Chimassorb 944, and UV5050 were used. This color change was likely related to the primary or secondary amines that those HTA compounds contain. It is well known that at high temperature the amines can react with certain fluoropolymers, especially those made with VDF, to generate dark colors. The primary and secondary amines are nucleophilic and may catalyze the dehydrofluorination that forms unsaturated, conjugated color species along the polymer backbone.

The color of EFEP blends that contained UV3529, Chimassorb 944, and UV5050 also became dark. Since EFEP does not contain VDF in the chain, it was reasonable to speculate that HTA compound-containing primary or secondary amine could also react with other fluoropolymers such as ETFE to generate color. No color change was observed on blends that contained HTA compounds such as T662 that did not contain primary or secondary amines. The white samples indicated immiscibility between the UV additives (UVLA compounds and HTA compounds) and the fluoropolymer matrix. From the solubility and polymer solution interaction parameters, most HTA compounds have good compatibility/miscibility with organic UVLA compounds or have much better miscibility with UVLA compounds than with fluoropolymers. Therefore, it is plausible to consider that the HTA compounds and UVLA compounds might form aggregates with one another within the fluoropolymer matrices.

TABLE 3

Blends of PVDF or EFEP with various HTA and UV absorbers

| Fluoro-polymer | HTA, (1% by weight) | HTA type | UVLA compound, (1% by weight) | Blend Color |
|---|---|---|---|---|
| PVDF | UV3529 | Secondary | UV 531 | Deep black |
| PVDF | Chimassorb 944 | Secondary | UV 531 | Deep black |
| PVDF | UV5050 | Secondary | UV 531 | Deep black |
| PVDF | T662 | Tertiary | UV 531 | White |
| PVDF | T662 | Tertiary | UV 3030 | White |
| EFEP | UV3529 | Secondary | UV 531 | Black |
| EFEP | Chimassorb 944 | Secondary | UV 531 | Black |
| EFEP | UV5050 | Secondary | UV 531 | Black |
| EFEP | T662 | Tertiary | UV 531 | White |
| EFEP | T662 | Tertiary | T 400 | White |

Example 8

In addition to the type of HTA compound, the MW of the HTA compound also needs to be considered. High MW HTA compounds could have lower migration rates and therefore higher stability in the fluoropolymer. Therefore, it is better to select a high MW HTA compound that does not contain primary and secondary amine groups for this purpose. Given the hypotheses and data presented here, it appeared that T622 was a candidate that could best meet these requirements. It has molecular weight of a few thousand g/mole and it contains no primary or secondary amine groups (See FIG. 7 for the compound structure).

Figures 14A, 14B:
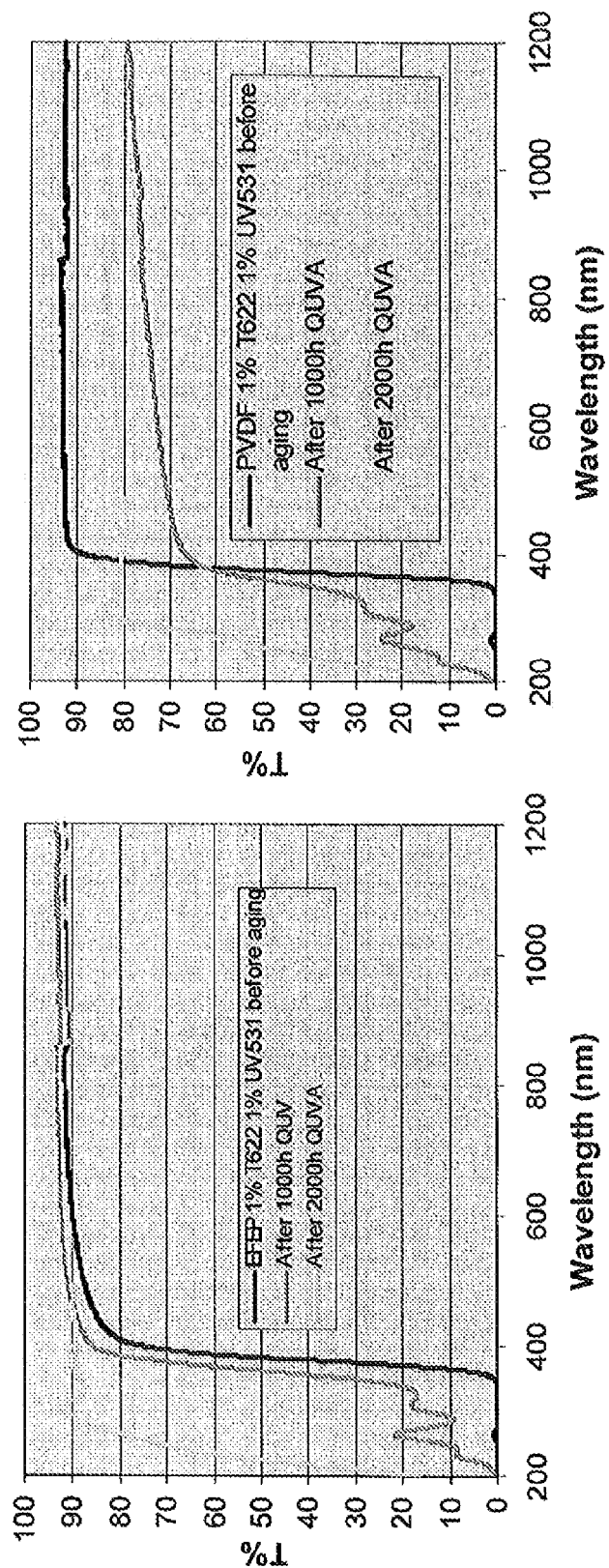
FIGS. 14A and 14B are graphs showing transmittance as a function of wavelength for samples of Example 8 before and after aging.

The UV-vis spectra of UV531 and T622 in EFEP before and after QUVA test are shown in FIG. 14A. After 1000 h QUVA, the UV transmittance was still below 20%. This value was lower than that for EFEP/1.5% UV531 after 1000 h QUV aging which was demonstrated above. The T622 slowed down the migration of UV531 and/or protected UV531 from UV decomposition, either of which increased the stability of UV531. However, the positive UV blocking retention was short lived as it mostly disappeared after 2000 h total of QUVA aging. Similar results were observed in PVDF containing 1% T622 and 1% UV531 (FIG. 14B).

Example 9

Figures 15A, 15B:
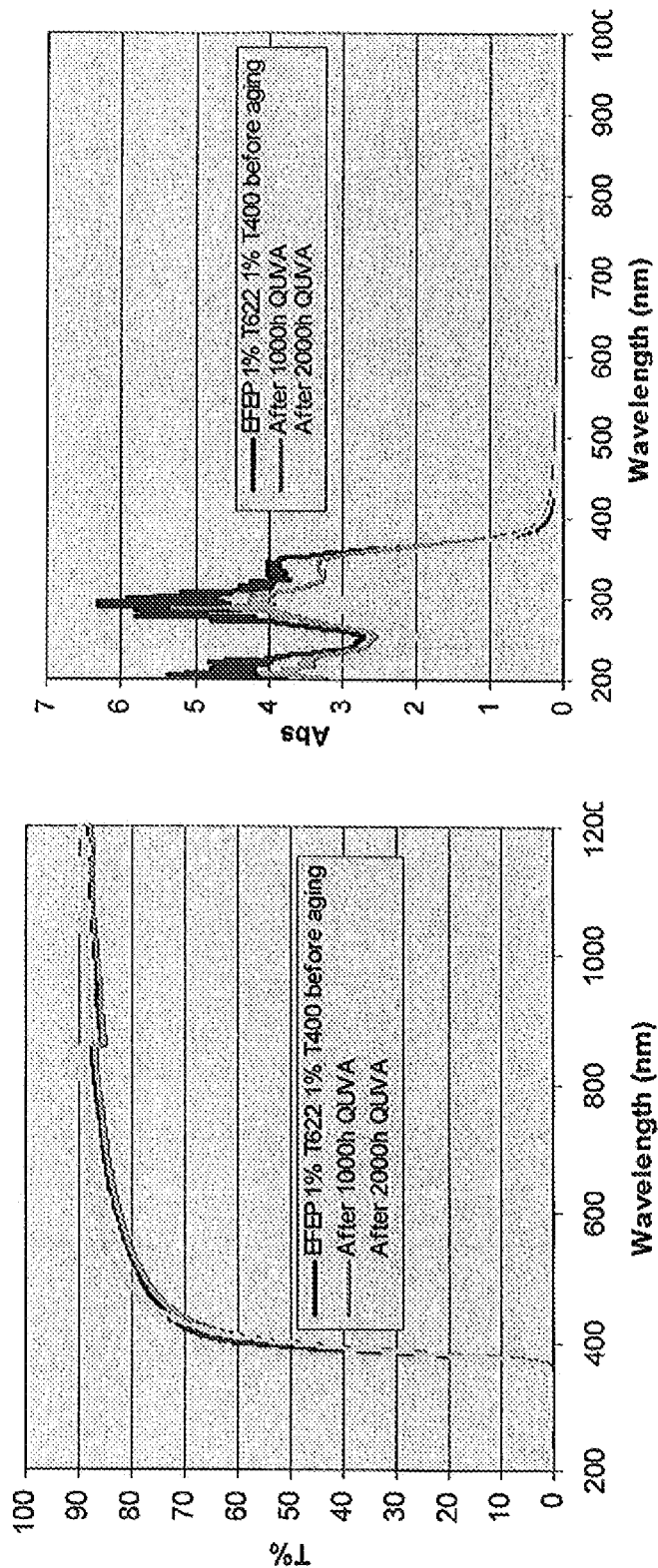
FIGS. 15A and 15B are graphs showing transmittance as a function of wavelength for samples of Example 9 before and after aging.

FIGS. 15A and 15B show the UV-vis spectra of T400 and T622 in EFEP before and after QUVA test. The MW of T400 is much greater than the MW of UV531. After 2000 h QUVA aging, the UV transmittance for the sample containing both T400 and T662 was not changed significantly (FIG. 14A), whereas the UV transmittance increased heavily for the sample without T662 after 1000 h QUVA aging (FIG. 8). The combination of T400 and T622 also improved the stability of T400 in the film. However, the absorbance decreased continually with the UV aging time (FIG. 14B). UV2126 has an even higher molecular weight than T400. Based on these data, a LTV absorber such as UV2126 might be expected to further improve the stability of the fluoropolymer UV blocking properties.

Example 10

Figures 16A, 16B:
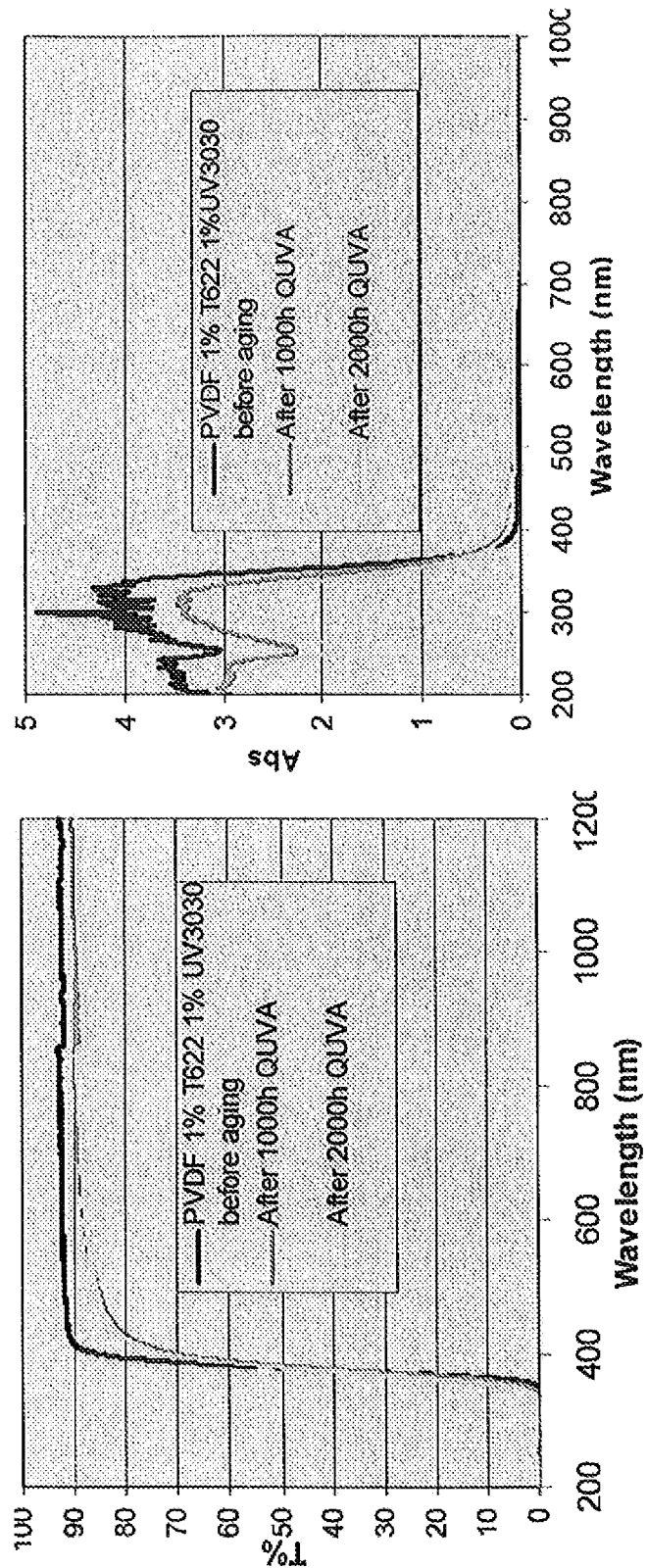
FIGS. 16A and 16B are graphs showing transmittance as a function of wavelength for samples of Example 10 before and after aging.

The UV-vis spectra of UV3030 and T622 in PVDF before and after QUVA test are shown in FIGS. 16A and 16B. Table 4 lists the light transmittance at 500 nm before and after 1000 h QUVA aging. Compared with data above that showed aging performance of a sample of PVDF containing 1% UV3030, the T622 also improved the stability of the UV blocking effect. However, after 1000 h QUV aging, the transmittance at 500 nm for the sample with T622 decreased from 92% to 85% while the transmittance decreased from 93% to only 90% for the sample without T622 (Table 3). The greater decrease in the transmittance when using T622 might be related to a reaction between PVDF and T622. Because a similar reduction in the transmittance after QUVA aging was also found for PVDF containing 1% UV531 and 1% T622 and was not found for EFEP containing 1% UV531 and 1% T622 (Table 3), it seems that PVDF containing T622 could have a discoloration issue (or transmittance reduction in visible range). Therefore, one would need to select an appropriate fluoropolymer matrix to have a better UV blocking effect and higher light transmittance after aging. Since the transmittance of EFEP was not reduced after aging, it should be plausible to suppose that the transmittance of FEP and ETFE would not be reduced based on the similarity of the chemical structures of the fluoropolymer chains among EFEP, FEP and ETFE. ETFE and FEP are two of the important fluoropolymers that are used for the protective top layer for flexible PV modules.

TABLE 4

Light transmittance at 500 nm before and after 1000 h QUVA aging

| Fluoropolymers | UV absorber, (1% by wt.) | HTA, (1% by wt.) | T % at 500 nm before aging | T % at 500 nm after 1000 h QUVA |
|---|---|---|---|---|
| PVDF | UV3030 | T622 | 92 | 85 |
| PVDF | UV3030 |  | 93 | 90 |
| PVDF | UV 531 | T622 | 93 | 71 |
| EFEP | UV 531 | T622 | 88 | 91 |

What is claimed is:

1. An optoelectronic device comprising a protective film, said protective film comprising:
    (a) a fluoropolymer content comprising at least one fluoropolymer, wherein less than 10 weight percent of the fluoropolymer content is derived from vinylidene fluoride;
    (b) a protection component in admixture with the fluoropolymer content that helps to protect the device from ultraviolet light degradation, wherein the film comprises from 0.01 to 10 parts by weight of the protection component per 100 parts by weight of the fluoropolymer content, and wherein the protection components comprises:
        i) at least one organic, UV light absorbing (UVLA) compound having a weight average molecular weight of at least 500; and
        (ii) at least one hindered, tertiary amine (HTA) compound having a weight average molecular weight of at least 1000, wherein the hindered tertiary amine comprises a cyclic moiety comprising a tertiary amine moiety, wherein a nitrogen atom of the amine moiety is a backbone constituent of the cyclic moiety and is N-substituted, wherein the hindered tertiary amine compound does not include a primary or a secondary amine moiety, and wherein the protection component comprises a weight ratio of the at least one UVLA compound(s) to the at least one hindered tertiary amine compound that is in the range from 1:50 to 50:1.

2. The optoelectronic device of claim 1, wherein the fluoropolymer content comprises one or more fluoropolymers selected from the group consisting of a copolymer of an alkene monomer and a fluorinated monomer, fluorinated ethylene propylene (FEP), ethylene-tetrafluoroethylene (ETFE), and polytetrafluoroethylene-perfluoropropylvinylether (PFA).

3. The optoelectronic device of claim 1, wherein the HTA compound comprises antioxidant characteristics.

4. The optoelectronic device of claim 1, wherein the optoelectronic device comprises a solar cell.

5. The device of claim 4 wherein the solar cell is flexible.

6. The optoelectronic device of claim 4, wherein the solar cell comprises a semiconductor layer comprising, copper, indium, and gallium.

7. The optoelectronic device of claim 1, wherein 0 weight percent of the fluoropolymer content is derived from vinylidene fluoride.

8. The optoelectronic device of claim 1, wherein the UVLA compound comprises a benzophenone moiety.

9. The optoelectronic device of claim 8, wherein the UVLA compound comprises a benzophenone moiety having at least one pendant OH moiety and at least one pendant —OR moiety.

10. The optoelectronic device of claim 1, wherein the UVLA compound comprises a benzotriazole moiety, a triazine moiety, or an oxalanilide moiety.

11. The optoelectronic device of claim 1, wherein the HTA compound the following formula:

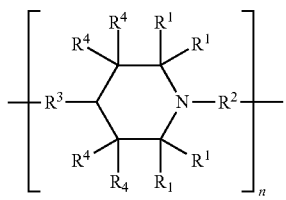

wherein each $R^1$ independently is a linear, branched, or cyclic aliphatic or aromatic monovalent moiety other than H or is a co-member of a ring structure; $R^2$ is an aliphatic or aromatic divalent moiety that is straight, branched, or cyclic; $R^3$ is O, S, or independently a divalent moiety according to the definition of $R^2$; each $R^4$ independently is H or a monovalent or co-ring member according to the definition of $R^1$; and n has a value such that the weight average molecular weight of the compound is at least 1000.

12. The optoelectronic device of claim 1, wherein the HTA compound has a chemical formula:

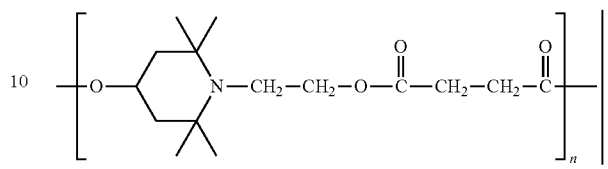

wherein n has a value such that the compound has a number average molecular weight of about 3100 to about 4000.

13. The optoelectronic device of claim 1, wherein the film has an elastic modulus in the range from $10^5$ to $10^{10}$ Pa.

14. The optoelectronic device of claim 1, wherein the film has a visible light transmittance higher than 70%.

15. The optoelectronic device of claim 1, wherein the film has a UV light transmittance at 350 nm below 50%.

* * * * *